United States Patent
Ding et al.

(10) Patent No.: US 10,615,192 B2
(45) Date of Patent: Apr. 7, 2020

(54) ARRAY SUBSTRATE ASSEMBLY, METHOD OF MANUFACTURING ARRAY SUBSTRATE ASSEMBLY, DISPLAY PANEL AND DISPLAY APPARATUS

(71) Applicants: BOE TECHNOLOGY GROUP CO., LTD., Beijing (CN); Hefei Xinsheng Optoelectronics Technology Co., Ltd., Hefei, Anhui (CN)

(72) Inventors: Yuankui Ding, Beijing (CN); Guangcai Yuan, Beijing (CN); Ce Zhao, Beijing (CN); Bin Zhou, Beijing (CN); Jun Cheng, Beijing (CN); Zhaofan Liu, Beijing (CN); Yingbin Hu, Beijing (CN); Yongchao Huang, Beijing (CN)

(73) Assignees: BOE TECHNOLOGY GROUP CO, LTD., Beijing (CN); HEFEI, XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/030,825

(22) Filed: Jul. 9, 2018

(65) Prior Publication Data
US 2019/0157308 A1 May 23, 2019

(30) Foreign Application Priority Data
Nov. 20, 2017 (CN) .......................... 2017 1 1157110

(51) Int. Cl.
*H01L 27/12* (2006.01)
*H01L 29/786* (2006.01)
(Continued)

(52) U.S. Cl.
CPC ............ *H01L 27/127* (2013.01); *G03F 7/038* (2013.01); *G03F 7/16* (2013.01); *G03F 7/2002* (2013.01);
(Continued)

(58) Field of Classification Search
CPC ............ H01L 27/127; H01L 29/66969; H01L 27/1262; H01L 29/7869; H01L 27/1288;
(Continued)

(56) References Cited

U.S. PATENT DOCUMENTS

2004/0087162 A1  5/2004  Vogeli
2014/0313443 A1* 10/2014  Chiang ............. H01L 29/42384
                                              349/42
(Continued)

FOREIGN PATENT DOCUMENTS

CN  101135865 A  3/2008
CN  101136327 A  3/2008
(Continued)

OTHER PUBLICATIONS

First Chinese Office Action dated Oct. 28, 2019, received for corresponding Chinese Chinese Application No. 201711157110.9.

*Primary Examiner* — Karen Kusumakar
(74) *Attorney, Agent, or Firm* — Kinney & Lange, P.A.

(57) ABSTRACT

A method of manufacturing an array substrate assembly, an array substrate assembly manufactured by the method, and a display panel including the array substrate assembly are disclosed. The method includes: providing a substrate, the substrate having a first region as a preset semiconductor-removed region, and a second region as a remaining region; forming, in the first region of the substrate, a semiconductor removing layer corrodible by a corrosive solution; and forming a semiconductor layer on the substrate formed with
(Continued)

---

Forming, on the substrate, a semiconductor removing material layer which is corrodible by the corrosive solution and which has a first portion corresponding to the first region, and a second portion corresponding to the second region — S101

Etching the second portion of the semiconductor removing material layer so that the second portion of the semiconductor removing material layer is removed while the first portion of the semiconductor removing material layer is retained, so as to form the semiconductor removing layer — S102 the semiconductor removing layer, so that the semiconductor layer covers the semiconductor removing layer.

20 Claims, 2 Drawing Sheets

(51) Int. Cl.
    *H01L 21/027* (2006.01)
    *G03F 7/038* (2006.01)
    *G03F 7/20* (2006.01)
    *G03F 7/26* (2006.01)
    *G03F 7/42* (2006.01)
    *G03F 7/16* (2006.01)
    *H01L 29/66* (2006.01)

(52) U.S. Cl.
    CPC .............. *G03F 7/2037* (2013.01); *G03F 7/26* (2013.01); *G03F 7/422* (2013.01); *H01L 21/0274* (2013.01); *H01L 27/1225* (2013.01); *H01L 27/1262* (2013.01); *H01L 27/1288* (2013.01); *H01L 29/66969* (2013.01); *H01L 29/7869* (2013.01)

(58) Field of Classification Search
    CPC ... H01L 27/1225; H01L 21/0274; G03F 7/16; G03F 7/422; G03F 7/2037; G03F 7/2002; G03F 7/038; G03F 7/26
    See application file for complete search history.

(56) References Cited

U.S. PATENT DOCUMENTS

2017/0236706 A1    8/2017    Yoon et al.
2018/0130827 A1*    5/2018    Lee .................... H01L 27/1248

FOREIGN PATENT DOCUMENTS

| CN | 102800576 A | 11/2012 |
| --- | --- | --- |
| CN | 103560083 A | 2/2014 |
| CN | 105514031 A | 4/2016 |
| CN | 106575607 A | 4/2017 |

* cited by examiner

ARRAY SUBSTRATE ASSEMBLY, METHOD OF MANUFACTURING ARRAY SUBSTRATE ASSEMBLY, DISPLAY PANEL AND DISPLAY APPARATUS

CROSS-REFERENCE TO RELATED APPLICATION

This application claims the benefit of Chinese Patent Application No. 201711157110.9, filed with the State Intellectual Property Office of China on Nov. 20, 2017, the whole disclosure of which is incorporated herein by reference.

BACKGROUND

Technical Field

Embodiments of the present disclosure relate to an array substrate assembly, a method of manufacturing the array substrate assembly, a display panel and a display apparatus.

Description of the Related Art

In a manufacturing process of a thin film transistor (TFT) of an array substrate assembly, when a layer of transparent oxide semiconductor is formed, a local crystallization of the transparent oxide semiconductor probably occurs.

SUMMARY

Embodiments of the present disclosure provide a method of manufacturing an array substrate assembly, the method comprising: providing a substrate, the substrate having a first region as a preset semiconductor-removed region, and a second region as a remaining region; forming, in the first region of the substrate, a semiconductor removing layer corrodible by a corrosive solution; and forming a semiconductor layer on the substrate formed with the semiconductor removing layer, so that the semiconductor layer covers the semiconductor removing layer.

According to embodiments of the present disclosure, the method further comprises: patterning the semiconductor layer by means of the corrosive solution, while the semiconductor removing layer is corroded to be removed by the corrosive solution.

According to embodiments of the present disclosure, the method further comprises: etching the semiconductor layer by means of an etching solution to form a semiconductor pattern, while the semiconductor removing layer is corroded to be removed by using the etching solution as the corrosive solution.

According to embodiments of the present disclosure, the method further comprises: applying a photoresist to the semiconductor layer to form a photoresist layer; exposing and developing the photoresist layer; etching the semiconductor layer; and stripping the photoresist layer by means of a stripping solution, so as to form a semiconductor pattern, while the semiconductor removing layer is corroded to be removed by using the stripping solution as the corrosive solution.

According to embodiments of the present disclosure, forming the semiconductor removing layer in the first region of the substrate comprises: forming, on the substrate, a semiconductor removing material layer which is corrodible by the corrosive solution and which has a first portion corresponding to the first region, and a second portion corresponding to the second region; and etching the second portion of the semiconductor removing material layer so that the second portion of the semiconductor removing material layer is removed while the first portion of the semiconductor removing material layer is retained, so as to form the semiconductor removing layer.

According to embodiments of the present disclosure, etching the second portion of the semiconductor removing material layer comprises: forming an etch stop layer on the first portion of the semiconductor removing material layer.

According to embodiments of the present disclosure, the method further comprises: removing the etch stop layer.

According to embodiments of the present disclosure, the method further comprises: forming an etch stop layer on a portion of the semiconductor layer corresponding to the second region prior to patterning the semiconductor layer by means of the corrosive solution.

According to embodiments of the present disclosure, the semiconductor removing layer comprises a metal or negative photoresist reactable with the corrosive solution.

According to embodiments of the present disclosure, the semiconductor removing layer comprises a metal reactable with the corrosive solution.

According to embodiments of the present disclosure, the semiconductor removing layer comprises a negative photoresist reactable with the corrosive solution.

According to embodiments of the present disclosure, the corrosive solution comprises: an etching solution and/or a stripping solution for patterning the semiconductor layer.

According to embodiments of the present disclosure, patterning the semiconductor layer by means of the corrosive solution comprises: forming an etch stop layer on a portion of the semiconductor layer corresponding to the second region; and placing into the corrosive solution the array substrate assembly formed with the etch stop layer on the portion of the semiconductor layer corresponding to the second region, so that the semiconductor removing layer corresponding to the first region is corroded to be removed by the corrosive solution.

According to embodiments of the present disclosure, forming the semiconductor removing layer in the first region of the substrate comprises: forming a semiconductor removing material layer on the substrate from a photoresist, the semiconductor removing material layer having a first portion corresponding to the first region, and a second portion corresponding to the second region; and exposing and developing the semiconductor removing material layer so that the second portion of the semiconductor removing material layer is removed while the first portion of the semiconductor removing material layer is retained, so as to form the semiconductor removing layer.

According to embodiments of the present disclosure, the method further comprises: applying a photoresist on the semiconductor layer to form a photoresist layer; exposing and developing the photoresist layer; etching the semiconductor layer; and stripping the photoresist layer by means of a stripping solution, so as to form a semiconductor pattern, while the semiconductor removing layer is corroded to be removed by using the stripping solution as the corrosive solution.

According to embodiments of the present disclosure, the photoresist comprises a negative photoresist.

According to embodiments of the present disclosure, the method further comprises: patterning the semiconductor layer; and corroding the semiconductor removing layer by the corrosive solution, so that the semiconductor removing layer is removed.

Embodiments of the present disclosure further provide an array substrate assembly, the array substrate assembly being manufactured by the above method.

Embodiments of the present disclosure further provide a display panel comprising the above array substrate assembly.

Embodiments of the present disclosure further provide a display apparatus comprising the above display panel.

Additional aspects and advantages of the present disclosure will be set forth in part in the description which follows and, in part, will be apparent from the description, or may be learned by practice of the embodiments of the present disclosure.

DETAILED DESCRIPTION OF EMBODIMENTS

Figure 1:
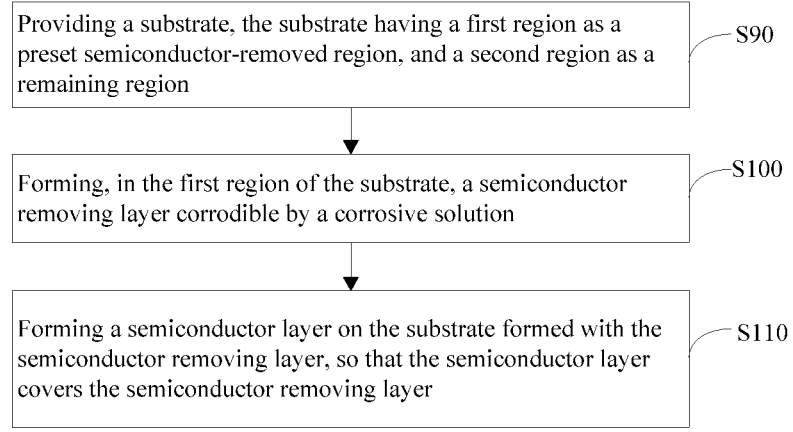
FIG. 1 is a schematic flow diagram of a method of manufacturing an array substrate assembly according to an embodiment of the present disclosure.

A further description of the disclosure will be made in detail below with reference to embodiments of the present disclosure taken in conjunction with the accompanying drawings, in which like reference numerals refer to like elements throughout.

Embodiments of the present disclosure provide a method of manufacturing an array substrate assembly. Referring to FIG. 1, FIG. 3, FIG. 5 and FIG. 6, the method includes:

a step S90 of providing a substrate 10, the substrate 10 having a first region 11 as a preset semiconductor-removed region, and a second region 12 as a remaining region;

a step S100 of forming, in the first region 11 of the substrate 10, a semiconductor removing layer 20 corrodible by a corrosive solution; and a step S110 of forming a semiconductor layer 30 on the substrate 10 formed with the semiconductor removing layer 20, so that the semiconductor layer 30 covers the semiconductor removing layer 20.

In the method of manufacturing the array substrate assembly according to the embodiments of the present disclosure, the semiconductor removing layer 20 easily corrodible by the corrosive solution is formed in the first region 11. The semiconductor removing layer 20 is corroded by the corrosive solution in a sequent step, so that the semiconductor removing layer is dissolved in the corrosive solution. Thereby, a support for a film on the semiconductor removing layer 20 is lost. As a result, crystalline semiconductor remaining in an etching process is effectively removed by the method while the method causes less damage to equipment, is simple in technology, and reduces energy consumption and cost.

For example, a method of manufacturing a pattern of oxide semiconductor of a thin film transistor (TFT) of an array substrate assembly includes: depositing an oxide semiconductor material layer; applying a photoresist to the oxide semiconductor material layer to form a photoresist layer; exposing and developing the photoresist layer; etching the oxide semiconductor material layer; and stripping the photoresist layer. Thereby, the pattern of the oxide semiconductor is formed. The inventors discovered in the course of practice that an oxide semiconductor is relatively sensitive to a temperature so that the oxide semiconductor easily suffers from a problem of crystallization when the temperature is high, and a degree of crystallization of the oxide semiconductor is exacerbated as the temperature increases. The crystalline oxide semiconductor formed by the crystallization cannot be etched by an etching solution for an amorphous oxide semiconductor, so that the crystalline oxide semiconductor is remained, causing bright spots in a display panel.

Therefore, in view of the problem, the semiconductor removing layer 20 is introduced in the embodiments of the present disclosure. The semiconductor removing layer 20 has a characteristic that it is corrodible by a corrosive solution.

Figure 3:
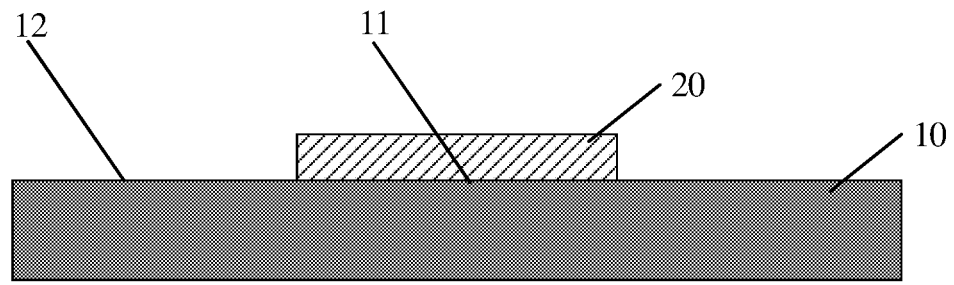
FIG. 3 is a schematic diagram showing a configuration of an array substrate assembly according to an embodiment of the present disclosure, in which a semiconductor removing layer is formed in a preset semiconductor-removed region of a substrate.
Figure 4:
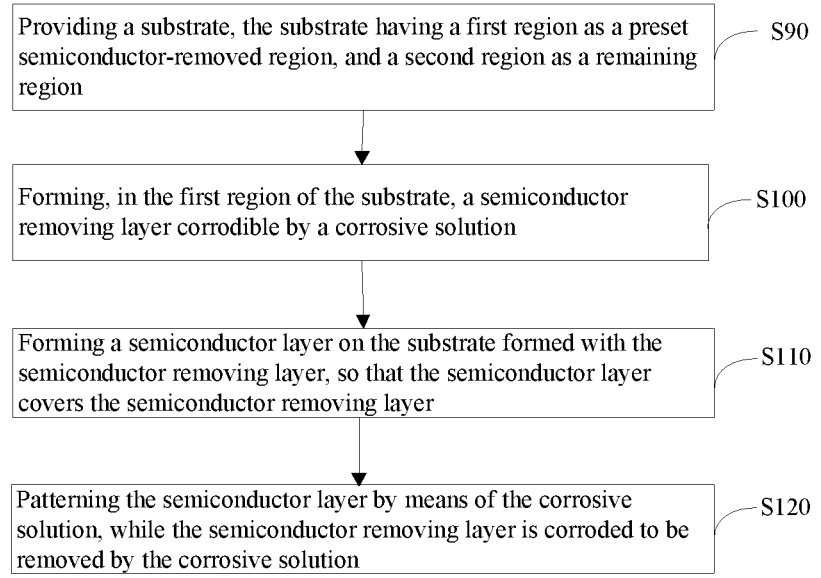
FIG. 4 is a schematic flow diagram of a method of manufacturing an array substrate assembly according to another embodiment of the present disclosure.
Figure 5:
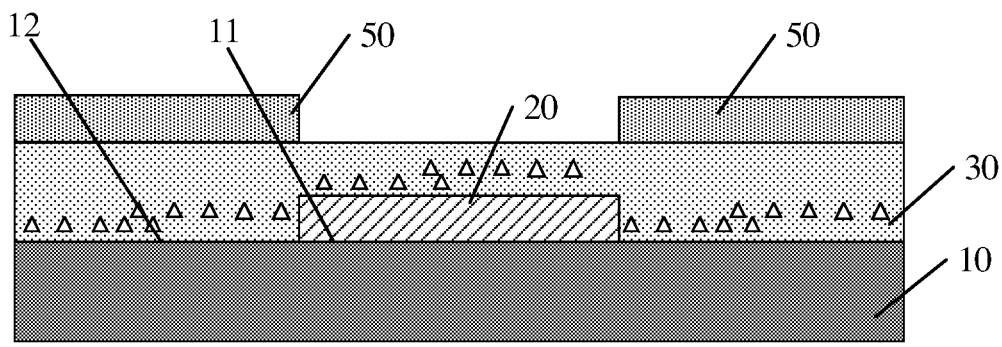
FIG. 5 is a schematic diagram showing a configuration of an array substrate assembly according to an embodiment of the present disclosure, in which an etch stop layer is formed in a semiconductor-retained region of the substrate.
Figure 6:
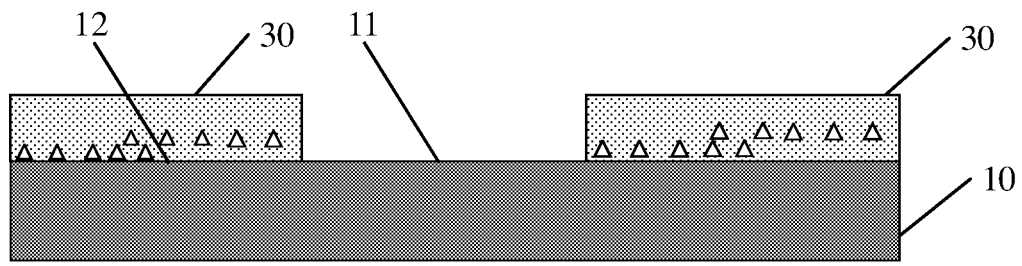
FIG. 6 is a schematic diagram showing a configuration of an array substrate assembly according to an embodiment of the present disclosure, from which a portion of a semiconductor layer in the semiconductor-removed region of the substrate has been removed.

According to embodiments of the present disclosure, referring to FIG. 3, FIG. 5, and FIG. 6, the method further includes: patterning the semiconductor layer 30 by means of the corrosive solution, while the semiconductor removing layer 20 is corroded to be removed by the corrosive solution. As an example, the method further includes: etching the semiconductor layer 30 by means of an etching solution to form a semiconductor pattern, while the semiconductor removing layer 20 is corroded to be removed by using the etching solution as the corrosive solution. As another example, the method further includes: applying a photoresist to the semiconductor layer 30 to form a photoresist layer; exposing and developing the photoresist layer; etching the semiconductor layer 30; and stripping the photoresist layer by means of a stripping solution, so as to form a semiconductor pattern, while the semiconductor removing layer 20 is corroded to be removed by using the stripping solution as the corrosive solution.

According to the embodiments of the present disclosure, in a sequent patterning process, the semiconductor removing layer 20 is corroded to be dissolved by a corrosive solution used in the patterning process. Thereby, the semiconductor removing layer 20 is removed. As a result, a support for a substance on the semiconductor removing layer 20 is lost, so that the substance will also be separated from the substrate 10, exposing a portion of the substrate 10 in a region where the semiconductor removing layer 20 is located. Due to existence of the semiconductor removing layer 20, it is easy to completely clean the substance on the semiconductor removing layer 20 and expose the portion of the substrate 10, avoiding a short circuit of a circuit formed by the patterning.

According to the embodiments of the present disclosure, a method of forming the semiconductor removing layer 20 includes: methods such as applying, vapor deposition, sputtering and the like, thereby forming the semiconductor removing layer 20 in the first region 11.

According to the embodiments of the present disclosure, patterning the oxide semiconductor material layer includes: applying a photoresist to the oxide semiconductor material layer to form a photoresist layer; exposing and developing the photoresist layer; etching the oxide semiconductor material layer; and stripping the photoresist layer. Any one of an etching solution for etching the oxide semiconductor material layer and a stripping solution for stripping the photoresist layer may serve as the corrosive solution. Therefore, the semiconductor removing layer 20 can be corroded by the corrosive solution in the patterning process, so that the semiconductor removing layer is dissolved in the corrosive solution, thereby removing the semiconductor removing layer 20.

According to an example of the present disclosure, referring to FIG. 5 and FIG. 6, the method further includes: patterning the semiconductor layer 30; and corroding the semiconductor removing layer 20 by a corrosive solution, so that the semiconductor removing layer 20 is removed. In other words, after the semiconductor layer 30 is patterned, the semiconductor removing layer 20 is corroded to be removed by the corrosive solution.

According to another example of the present disclosure, referring to FIG. 5 and FIG. 6, after the oxide semiconductor material layer is etched and before the photoresist layer is stripped, the semiconductor removing layer 20 is corroded to be removed by a corrosive solution. A transparent oxide semiconductor film is made of a semiconductor material having a wide forbidden band, and has a high conductivity and a high transmissivity within a visible light range, so that the transparent oxide semiconductor film can improve performance parameters of a display device, such as a light transmittance and a resistance of a display device. Therefore, the semiconductor layer 30 in the present embodiment may be a transparent oxide semiconductor layer 30, such as an indium tin oxide (ITO) layer, an indium zinc oxide (IZO) layer, or the like. However, when a deposition thickness of the transparent oxide semiconductor layer 30 exceeds a certain thickness in a deposition process, a temperature of a substrate will rise due to an excessively long deposition time, thereby resulting in a local crystallization of an ITO. For example, when the deposition thickness of the ITO exceeds 700 Å, the ITO will crystallize.

According to embodiments of the present disclosure, a semiconductor layer 30 is formed on the substrate 10 formed with the semiconductor removing layer 20, by a method such as vapor deposition, sputtering, spray coating or the like. The semiconductor layer 30 covers the semiconductor removing layer 20 formed in the step S100.

The semiconductor removing layer 20 can be corroded to be removed by the corrosive solution in the patterning process. A support for the semiconductor layer 30 on the semiconductor removing layer 20 is lost. As a result, the semiconductor removing layer 20 together with the semiconductor layer 30 and formed crystal grains on the semiconductor removing layer 20, in the first region 11 is separated from the substrate 10, solving problems of crystallization of the semiconductor and residue of the crystalline semiconductor due to an excessively great thickness or an excessively high deposition temperature of the semiconductor layer 30. In this way, it can be ensured that the deposition thickness and temperature of the semiconductor layer 30 are not limited, facilitating improvement of performance parameters of a product, such as a transmittance and a resistance.

Figure 2:
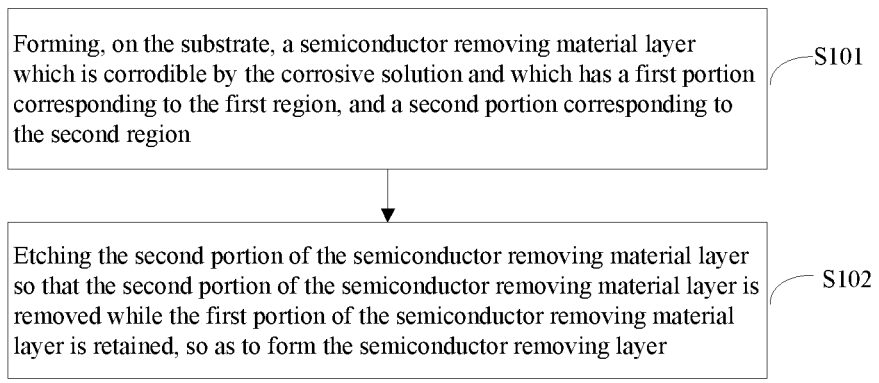
FIG. 2 is a schematic flow diagram of specific steps in the step S100 in FIG. 1.

In an embodiment, referring to FIG. 2 and FIG. 3, the step S100 includes:

a step S101 of forming a semiconductor removing material layer on the substrate 10, the semiconductor removing material layer having a first portion corresponding to the first region 11, and a second portion corresponding to the second region 12; and a step S102 of etching the second portion of the semiconductor removing material layer so that the second portion of the semiconductor removing material layer is removed while the first portion of the semiconductor removing material layer is retained, so as to form the semiconductor removing layer 20.

According to embodiments of the present disclosure, in order to form the semiconductor removing layer 20 on the substrate 10, the semiconductor removing layer 20 is deposited on the substrate 10 for example by vapor deposition, sputtering, spray coating, applying, or the like, so that the semiconductor removing layer 20 formed on the substrate 10 is a complete continuous layer. The thickness of the semiconductor removing layer 20 depends on corrosion process conditions such as a corrosion time, a concentration of the corrosive solution, and a component of the corrosive solution. The semiconductor removing layer 20 has a characteristic that it is corrodible by a corrosive solution.

According to embodiments of the present disclosure, the step of etching the second portion of the semiconductor removing material layer includes:

forming an etch stop layer on the first portion of the semiconductor removing material layer; etching the second portion of the semiconductor removing material layer so that the second portion of the semiconductor removing material layer is removed while the first portion of the semiconductor removing material layer is retained; and removing the etch stop layer.

After the step is completed, the array substrate assembly has a configuration schematically shown in FIG. 3. In this case, the array substrate assembly includes the substrate 10, and the semiconductor removing layer 20 in the first region 11.

According to embodiments of the present disclosure, referring to FIG. 3, the step of forming the semiconductor removing layer 20 in the first region 11 on the substrate 10 includes: forming, on the substrate 10, a semiconductor removing material layer from a photoresist, the semiconductor removing material layer being corrodible by the corrosive solution, and having a first portion corresponding to the first region 11, and a second portion corresponding to the second region 12; and exposing and developing the semiconductor removing material layer so that the second portion of the semiconductor removing material layer 20 is removed while the first portion of the semiconductor removing material layer 20 is retained, so as to form the semiconductor removing layer 20. The photoresist may be a negative photoresist.

According to embodiments of the present disclosure, referring to FIG. 3, FIG. 5 and FIG. 6, the method further includes: applying a photoresist to the semiconductor layer 30 to form a photoresist layer; exposing and developing the photoresist layer; etching the semiconductor layer 30; and stripping the photoresist layer by means of a stripping solution, so as to form a semiconductor pattern, while the semiconductor removing layer 20 is corroded to be removed by using the stripping solution as the corrosive solution.

In the present embodiment, the etch stop layer may be a photoresist layer. Before the photoresist layer is exposed, a layer of photoresist is applied to a surface of the semiconductor removing layer 20 to form an etch stop layer. After irradiated by an ultraviolet ray or an electronic beam, the characteristic of the photoresist itself is changed. Exposed negative photoresist or non-exposed positive photoresist will be retained. In this way, a designed microstructure or nanostructure is transferred to the photoresist layer. A pattern of the photoresist layer is transferred to a film under the photoresist layer by sequent processes such as etching and the like.

The pattern of the photoresist layer is formed by exposing and developing. By etching, the second portion of the semiconductor removing material layer is removed while the first portion of the semiconductor removing material layer is retained.

According to embodiments of the present disclosure, the second region 12 may be a semiconductor-retained region.

According to embodiments of the present disclosure, by etching, the second portion of the semiconductor removing material layer corresponding to the second region 12 is etched away while the first portion of the semiconductor removing material layer corresponding to the first region 11 is retained, thereby forming the semiconductor removing layer 20. However, the etch stop layer on the semiconductor removing layer 20 corresponding to the first region 11 still exists. The etch stop layer needs to be removed. For example, the etch stop layer is removed by means of a stripping solution, so that only the semiconductor removing layer 20 exists in the first region 11.

In an embodiment, referring to FIG. 3 to FIG. 6, a method of manufacturing an array substrate assembly includes:

a step S90 of providing a substrate 10, the substrate 10 having a first region 11 as a preset semiconductor-removed region, and a second region 12 as a remaining region;

a step S100 of forming, in the first region 11 of the substrate 10, a semiconductor removing layer 20 corrodible by a corrosive solution;

a step S110 of forming a semiconductor layer 30 on the substrate 10 formed with the semiconductor removing layer 20, so that the semiconductor layer 30 covers the semiconductor removing layer 20; and a step S120 of patterning the semiconductor layer 30 by means of the corrosive solution, while the semiconductor removing layer 20 is corroded to be removed by the corrosive solution.

Before the semiconductor layer 30 is patterned, in order to retain a portion of the semiconductor layer 30 in the second region 12, an etch stop layer needs to be formed on the portion of the semiconductor layer 30 corresponding to the second region 12 before the semiconductor layer 30 is etched. The etch stop layer may be formed from a photoresist. In this case, the array substrate assembly has a configuration schematically shown in FIG. 5. The array substrate assembly includes: the substrate 10, the semiconductor removing layer 20 in the first region 11, the semiconductor layer 30, and the etch stop layer 50 on the semiconductor layer 30 in the second region 12. The array substrate assembly formed with the etch stop layer on the semiconductor layer 30 in the second region 12 is placed into the corrosive solution, so that the semiconductor removing layer 20 corresponding to the first region 11 is corroded to be removed by the corrosive solution.

The process of patterning the semiconductor layer 30 includes an etching process and a stripping process. In the method of manufacturing the array substrate assembly, the etching process and the stripping process are common manufacturing steps. In the present embodiment, a wet etching is used in the etching process. An etching solution is needed in the wet etching, while a stripping solution is needed in the stripping process. The corrosive solution according to the embodiments of the present disclosure may be the etching solution or the stripping solution.

According to embodiments of the present disclosure, in order to save process steps and reduce a cost, the semiconductor removing layer 20 is made of a metal reactable with the etching solution, such as aluminum, iron or the like; a negative photoresist corrodible by the stripping solution; or indium gallium zinc oxide (IGZO).

In the case where the semiconductor removing layer 20 is made of the negative photoresist, the semiconductor removing layer 20 can be corroded by the stripping solution in the stripping possess, so as to be dissolved in the stripping solution. Thereby, the semiconductor layer 30 formed on the semiconductor removing layer 20 is not supported by a lower film so as to be separated automatically.

In the case where the semiconductor removing layer 20 is made of the metal, the metal reacts with the etching solution in the etching possess, so as to be dissolved in the etching solution. Thereby, the semiconductor layer 30 formed on the semiconductor removing layer 20 is not supported by a lower layer so as to be separated automatically.

The corrosive solution according to the embodiments of the present disclosure is the etching solution and/or the stripping solution. The two corrosive solutions are all common solutions for manufacturing an array substrate assembly, and are also solutions necessarily used in wet etching, so that it is unnecessary to additionally prepare a new corrosive solution. Compared with conventional manufacturing steps of the array substrate assembly, no new corrosion step is added, thereby simplifying a process of cleaning crystalline semiconductor remaining in the etching process.

Furthermore, in the embodiments of the present disclosure, the semiconductor removing layer 20 may be made of the same negative photoresist as the etch stop layer, or a metal easily reactable with the etching solution. Therefore, no new material is introduced for cleaning crystalline semiconductor remaining in the etching process.

After the etch stop layer formed on the semiconductor layer 30 in the second region 12 in the array substrate assembly is removed and the array substrate assembly is cleaned, the array substrate assembly has a configuration schematically shown in FIG. 6. In this case, the array substrate assembly includes: the substrate 10, and the semiconductor layer 30 in the second region 12. There is not the semiconductor layer 30 or residue of semiconductor material in the first region 11, and there is the semiconductor layer 30 only in the second region 12.

Embodiments of the present disclosure further provide an array substrate assembly. The array substrate assembly is manufactured by the method according to any one of the above embodiments. In addition, embodiments of the present disclosure further provide a display panel including the abovementioned array substrate assembly. Further, embodiments of the present disclosure further provide a display apparatus including the abovementioned display panel. The display apparatus may include any products or parts having display function, such as an electronic paper, an OLED (organic light-emitting device) panel, a mobile phone, a tablet computer, a TV, a display, a notebook computer, a digital frame, and a navigator.

As described above, in the embodiments of the present disclosure, the semiconductor removing layer 20 easily corrodible is formed in the first region 11. The semiconductor removing layer 20 is corroded by the corrosive solution in a sequent step, so that the semiconductor removing layer is dissolved in the corrosive solution. Thereby, a support for a film on the semiconductor removing layer 20 is lost. As a result, crystalline semiconductor remaining in the etching process is effectively removed by the method while the method is simple in technology, reduces damage to equipment, and decreases a manufacturing cost.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. A method of manufacturing an array substrate assembly, the method comprising:
    providing a substrate, the substrate having a first region as a preset semiconductor-removed region, and a second region as a remaining region;
    forming, in the first region of the substrate, a semiconductor removing layer corrodible by a corrosive solution;
    forming a semiconductor layer on the substrate formed with the semiconductor removing layer, so that the semiconductor layer covers the semiconductor removing layer; and
    patterning the semiconductor layer with the corrosive solution, while the semiconductor removing layer is corroded to be removed by the corrosive solution.

2. The method of claim 1, wherein forming the semiconductor removing layer in the first region of the substrate comprises:
    forming, on the substrate, a semiconductor removing material layer which is corrodible by the corrosive solution and which has a first portion corresponding to the first region, and a second portion corresponding to the second region; and
    etching the second portion of the semiconductor removing material layer so that the second portion of the semiconductor removing material layer is removed while the first portion of the semiconductor removing material layer is retained, so as to form the semiconductor removing layer.

3. The method of claim 2, wherein etching the second portion of the semiconductor removing material layer comprises:
    forming an etch stop layer on the first portion of the semiconductor removing material layer.

4. The method of claim 3, further comprising:
    removing the etch stop layer.

5. The method of claim 1, further comprising:
    forming an etch stop layer on a portion of the semiconductor layer corresponding to the second region prior to patterning the semiconductor layer with the corrosive solution.

6. The method of claim 1, wherein:
    the semiconductor removing layer comprises a metal or negative photoresist reactable with the corrosive solution.

7. The method of claim 1, wherein the corrosive solution comprises:
    an etching solution and/or a stripping solution for patterning the semiconductor layer.

8. The method of claim 1, wherein patterning the semiconductor layer with the corrosive solution comprises:
    forming an etch stop layer on a portion of the semiconductor layer corresponding to the second region; and
    placing into the corrosive solution the array substrate assembly formed with the etch stop layer on the portion of the semiconductor layer corresponding to the second region, so that the semiconductor removing layer corresponding to the first region is corroded to be removed by the corrosive solution.

9. The method of claim 1, wherein forming the semiconductor removing layer in the first region of the substrate comprises:
    forming a semiconductor removing material layer on the substrate from a photoresist, the semiconductor removing material layer having a first portion corresponding to the first region, and a second portion corresponding to the second region; and
    exposing and developing the semiconductor removing material layer so that the second portion of the semiconductor removing material layer is removed while the first portion of the semiconductor removing material layer is retained, so as to form the semiconductor removing layer.

10. The method of claim 9, further comprising:
    applying a photoresist on the semiconductor layer to form a photoresist layer;
    exposing and developing the photoresist layer;
    etching the semiconductor layer; and
    stripping the photoresist layer by means of a stripping solution, so as to form a semiconductor pattern, while the semiconductor removing layer is corroded to be removed by using the stripping solution as the corrosive solution.

11. The method of claim 10, wherein:
    the photoresist comprises a negative photoresist.

12. An array substrate assembly manufactured by the method according to claim 1.

13. A display panel comprising:
    the array substrate assembly according to claim 12.

14. A method of manufacturing an array substrate assembly, the method comprising:
    providing a substrate, the substrate having a first region as a preset semiconductor-removed region, and a second region as a remaining region;
    forming, in the first region of the substrate, a semiconductor removing layer corrodible by a corrosive solution;
    forming a semiconductor layer on the substrate formed with the semiconductor removing layer, so that the semiconductor layer covers the semiconductor removing layer, and
    etching the semiconductor layer with an etching solution to form a semiconductor pattern, while the semiconductor removing layer is corroded to be removed by using the etching solution as the corrosive solution.

15. The method of claim 14, wherein:
    the semiconductor removing layer comprises a metal reactable with the corrosive solution.

16. The method of claim 14, wherein forming the semiconductor removing layer in the first region of the substrate comprises:
    forming, on the substrate, a semiconductor removing material layer which is corrodible by the corrosive solution and which has a first portion corresponding to the first region, and a second portion corresponding to the second region; and
    etching the second portion of the semiconductor removing material layer so that the second portion of the semiconductor removing material layer is removed while the first portion of the semiconductor removing material layer is retained, so as to form the semiconductor removing layer.

17. The method of claim 14, wherein forming the semiconductor removing layer in the first region of the substrate comprises:

forming a semiconductor removing material layer on the substrate from a photoresist, the semiconductor removing material layer having a first portion corresponding to the first region, and a second portion corresponding to the second region; and exposing and developing the semiconductor removing material layer so that the second portion of the semiconductor removing material layer is removed while the first portion of the semiconductor removing material layer is retained, so as to form the semiconductor removing layer.

18. A method of manufacturing an array substrate assembly, the method comprising:

providing a substrate, the substrate having a first region as a preset semiconductor-removed region, and a second region as a remaining region;

forming, in the first region of the substrate, a semiconductor removing layer corrodible by a corrosive solution;

forming a semiconductor layer on the substrate formed with the semiconductor removing layer, so that the semiconductor layer covers the semiconductor removing layer;

applying a photoresist to the semiconductor layer to form a photoresist layer;

exposing and developing the photoresist layer;

etching the semiconductor layer; and stripping the photoresist layer with a stripping solution, so as to form a semiconductor pattern, while the semiconductor removing layer is corroded to be removed by using the stripping solution as the corrosive solution.

19. The method of claim 18, wherein:

the semiconductor removing layer comprises a negative photoresist reactable with the corrosive solution.

20. The method of claim 18, wherein forming the semiconductor removing layer in the first region of the substrate comprises:

forming, on the substrate, a semiconductor removing material layer which is corrodible by the corrosive solution and which has a first portion corresponding to the first region, and a second portion corresponding to the second region; and etching the second portion of the semiconductor removing material layer so that the second portion of the semiconductor removing material layer is removed while the first portion of the semiconductor removing material layer is retained, so as to form the semiconductor removing layer.

* * * * *